United States Patent
Croffie et al.

(10) Patent No.: US 7,313,508 B2
(45) Date of Patent: Dec. 25, 2007

(54) PROCESS WINDOW COMPLIANT CORRECTIONS OF DESIGN LAYOUT

(75) Inventors: Ebo Croffie, Portland, OR (US); Colin Yates, Clackamas, OR (US); Nicholas Eib, San Jose, CA (US); Christopher Neville, Portland, OR (US); Mario Garza, Sunnyvale, CA (US); Neal Callan, Lake Oswego, OR (US)

(73) Assignee: LSI Corporation, Milpitas, CA (US)

( * ) Notice: Subject to any disclaimer, the term of this patent is extended or adjusted under 35 U.S.C. 154(b) by 640 days.

(21) Appl. No.: 10/330,929

(22) Filed: Dec. 27, 2002

(65) Prior Publication Data

US 2004/0128118 A1   Jul. 1, 2004

(51) Int. Cl.
*G06F 17/50* (2006.01)

(52) U.S. Cl. .............. 703/14; 700/121; 716/2; 716/21; 430/5; 430/30

(58) Field of Classification Search .............. 703/14; 700/120, 121; 716/2, 11, 19, 21; 430/5, 430/30, 322, 311–313
See application file for complete search history.

(56) References Cited

U.S. PATENT DOCUMENTS

| | | | |
|---|---|---|---|
| 6,472,108 B1 | 10/2002 | Lin | 430/5 |
| 6,660,458 B2* | 12/2003 | Lin | 430/322 |
| 6,709,793 B1* | 3/2004 | Brankner et al. | 430/5 |
| 6,721,938 B2* | 4/2004 | Pierrat et al. | 716/19 |
| 6,745,372 B2* | 6/2004 | Cote et al. | 716/2 |
| 6,902,854 B2* | 6/2005 | Frankowsky | 430/30 |
| 2005/0262467 A1* | 11/2005 | Croffie | 716/19 |

OTHER PUBLICATIONS

Grobman et al., W. Reticle Enhancement technology: Implications and Challenges for Physical Design, Proceedings of the 38th Conference on Design Automation, ACM Press, Jun. 2001, pp. 73-78.*

Kahng et al., A.B. Subwavelength Lithography and its Potential Imapct on Design and EDA, Proceedings of the 36th ACM/IEEE Conference on Design Automation, ACM Press, Jun. 1999.*

Kahng et al., A.B. Subwavelength Optical Lithography: Challenges and Impact on Physical Design, Proceedings of the 1999 International Symposium on Physical Design, ACM Press, Apr. 1999, pp. 112-119.*

Rieger et al., M.L. Layout Design Methodologies for Sub-Wavelength Manuafacturing, Proceedings of the 38th Conference on Design Automation, ACM Press, Jun. 2001, pp. 85-88.*

Hagge et al., J.K. High-Yield Assembly of Multichip Modules Through Known-Good IC's and Effective Test Strategies, Proceedings of the IEEE, vol. 80, No. 12, Dec. 1992, pp. 1965-1994.*

Edgar et al., T.F. Automatic Control in Microelectronics Manufacturing: Practices, Challenges, and Possibilities, Automatica, vol. 36, No. 11, Nov. 2000, pp. 1567-1603.*

* cited by examiner

*Primary Examiner*—Russell Frejd
(74) *Attorney, Agent, or Firm*—Trexler Bushnell Giangiorgi & Blackstone, Ltd.

(57) ABSTRACT

The invention provides a method of performing process window compliant corrections of a design layout. The invention includes an operator performing the following steps: (1) simulating Develop Inspect Critical Dimension (DI CD) at best exposure conditions using the provided original layout pattern; (2) simulating DI CD at predefined boundary exposure conditions using the provided original layout pattern; (3) if the DI CD from step (1) meets the target DI CD definition, and the DI CD from step (2) meets process window specifications, convergence takes place; and (4) modifying the layout pattern and repeating steps (2) through (3) until DI CD from step (2) reaches the specification limit if any portion of step (3) is not achieved.

25 Claims, 10 Drawing Sheets

PROCESS WINDOW COMPLIANT CORRECTIONS OF DESIGN LAYOUT

BACKGROUND OF THE INVENTION

The present invention relates to a method of performing process window compliant corrections of design layout.

During the optical lithography step in integrated circuit fabrication, a device structure is patterned by imaging a mask onto a radiation sensitive film (photoresist or resist) overcoating different thin film materials on the wafer. These photoresist films capture the pattern deliniated through initial exposure to radiation and allow subsequent pattern transfer to the underlying layers. The radiation source, imaging optics, mask type and resist performance determine the minimum feature size that can be reproduced by the lithography process. Imaging of mask patterns with critical dimensions smaller than the exposure wavelength results in distorted images of the original layout pattern, primarily because of optical proximity effects of the imaging optics. Nonlinear response of the photoresist to variability in exposure tool and mask manufacturing process as well as variability in resist and thin film processes also contribute to image distortion. These distortions include variations in the line-widths of identically drawn features in dense and isolated environments (iso-dense bias), line-end pullback or line-end shortening from drawn positions and corner rounding. The process of correcting these types of distortions is called optical proximity correction or optical and process correction (OPC). OPC is a procedure of pre-distorting the mask layout by using simple shape manipulation rules (rulebased OPC) or fragmenting the original polygon into line segments and moving these segments to favorable positions as determined by a process model (model-based OPC). OPCed mask improves image fidelity on a wafer.

Current model-based OPC use the original layout as a target to do OPC corrections. While this approach corrects for image distortions at best process conditions to achieve target critical dimensions, this approach does not guarantee that the target critical dimensions will meet process window requirements. Process window requirements are requirements that the critical dimension is maintained to within a predetermined range (e.g., +/-10% from nominal critical dimension) if the resist image plane is varied within a given range centered about the focal plane (e.g., +/-0.2 µm out of focus (0.4 µm Depth Of Focus or DOF)), and/or the exposure energy is off target by a certain percent (e.g., +/-2.5% of nominal exposure energy (5% Exposure Latitude or EL)). Ensuring that process window requirements are met guarantees manufacturability of the photolithography step.

Currently, there is one known existing solution to this problem which is the addition of subresolution assist features (SRAF) to main features and model-based OPC is applied to improve process window, see, for example, U.S. Pat. No. 6,472,108. This one known solution, however, has a number of disadvantages associated therewith, which include the following:

1. Extrapolation of one-dimensional SRAF rules to two-dimensional circuit layouts presents a problem for which no exact solution exists within the bounds of manufacturability;
2. Discontinuous process window enhancement occurs because of the discrete nature of SRAF;
3. The mask is more difficult to manufacture since sub-design rule features have to be on the mask;
4. The write time of the mask is increased resulting in increasing the cost of the mask;
5. The mask has a higher probability for defects because of the increase in polygon count;
6. SRAF applications to arbitrary two-dimensional layout patterns is prone to corner printing; and
7. Corrected layout of SRAF with model-based OPC is more complex than model-based OPC without SRAF.

Therefore, an improved method of performing process window compliant corrections of a design layout is needed. The present invention provides such a method of performing process window compliant corrections of a design layout. Features and advantages of the present invention will become apparent upon a reading of the attached specification, in combination with a study of the drawings.

OBJECTS AND SUMMARY OF THE INVENTION

A primary object of the invention is to provide a simple method of performing process window compliant corrections on a design layout that guarantees manufacturability at the photolithography step of integrated circuit fabrication.

Another primary object of the invention is to provide a method of performing process window compliant corrections in a design layout that allows for optimization of photolithography and etch process in the case of Final Inspect Optical and Process Correction (FI OPC).

Yet another primary object of the invention is to provide a method of performing process window compliant corrections in a design layout such that the corrected layout has the same complexity as model-based OPC so that no additional cost is required for the making of masks, which is unlike SRAFs.

Briefly, and in accordance with the foregoing, the present invention provides a method of performing process window compliant corrections of a design layout. The invention includes an operator performing the following steps: (1) simulating Develop Inspect Critical Dimension (DI CD) at best exposure conditions using the provided original layout pattern; (2) simulating DI CD at predefined boundary exposure conditions using the provided original layout pattern; (3) if the DI CD from step (1) meets the target DI CD definition, and the DI CD from step (2) meets process window specifications, convergence takes place; and (4) modifying the layout pattern and repeating steps (2) through (3) until DI CD from step (2) reaches the specification limit if any portion of step (3) is not achieved.

BRIEF DESCRIPTION OF THE DRAWINGS

The features of the present invention which are believed to be novel are described in detail hereinbelow. The organization and manner of the structure and operation of the invention, together with further objects and advantages thereof, may best be understood by reference to the following description taken in connection with the accompanying drawings wherein like reference numerals identify like elements in which.

DETAILED DESCRIPTION OF THE ILLUSTRATED EMBODIMENT

While this invention may be susceptible to embodiment in different forms, there is shown in the drawings and will be described herein in detail, a specific embodiment with the understanding that the present disclosure is to be considered an exemplification of the principles of the invention, and is not intended to limit the invention to that as illustrated and described herein.

In order to provide a process window compliant correction of the present invention, an operator must use a graphic design system (GDS), which is a tool for viewing a design layout pattern. The GDS gives a target develop inspect critical dimension (DI CD) definition, with DI CD being the critical dimension after a wafer is exposed and developed. The target DI CD definition is the simulated DI CD, i.e., best exposure conditions, with the minimum deviation from the original layout pattern that meets a given depth of focus and process latitude specification. The original layout pattern is provided by the GDS.

Figure 1:
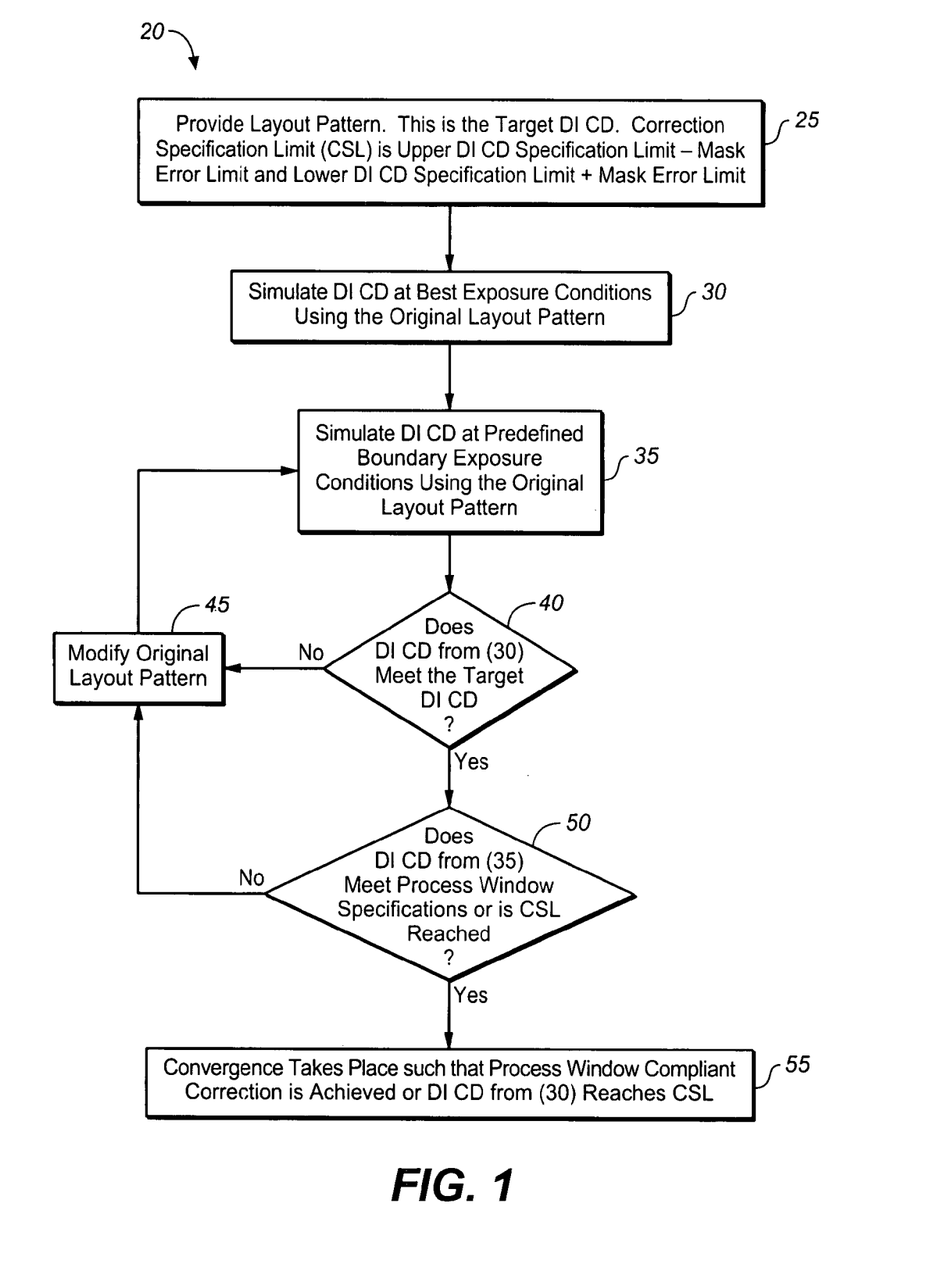
FIG. 1 is a flow chart illustrating develop inspect critical dimension process window compliant correction in accordance with an embodiment of the present invention.

A method of performing process window compliant corrections 20 in accordance with an embodiment of the present invention is illustrated in FIG. 1. The method 20 includes the following steps:
(1) Providing a layout pattern 25. The layout pattern provided is the target DI CD. The Correction Specification Limit (CSL), or the Correction Window, is the Upper DI CD specification limit minus the Mask error limit and the Lower DI CD specification limit plus the Mask error limit;
(2) Simulating DI CD at best exposure conditions using the original layout pattern 30;
(3) Simulating DI CD at predefined boundary exposure conditions using the original layout pattern 35. The predefined boundary exposure conditions are defocus and dose (contour threshold);
(4) Determining whether the DI CD from 30 meets the target DI CD from 25, 40;
  (a) If DI CD from 30 meets the target DI CD from 25, go to step (5);
  (b) If DI CD from 30 does not meet the target DI CD from 25, modify the original layout pattern 45, and return to step (3);
(5) Determining whether the DI CD from 35 meets process window requirements or whether CSL reached 50;
  (a) If DI CD from 35 meets process window requirements or CSL is reached, go to step (6);
  (b) If DI CD from 35 does not meet process window specifications, modify the original layout pattern 45, and return to step (3);
(6) Achieving process window compliant correction as convergence takes place or Dl CD from 30 reaches CSL 55.

The layout pattern that gives the target DI CD definition is the process window compliant correction.

The invention provides a number of advantages in comparison to the prior art. First of all, the invention guarantees process window for design manufacturability. Second, the mask does not freeze the lithography process. Different process conditions can be used with the same mask, provided the pre-etch process is calibrated via pre-etch characterization cells. Third, lithographers and etch engineers can continue to improve their process without the need for new masks, thus saving money on masks. Fourth, corrected layout has the same complexity as model based OPC, so there are not additional costs for mask making, unlike with SRAFs.

Figure 2:
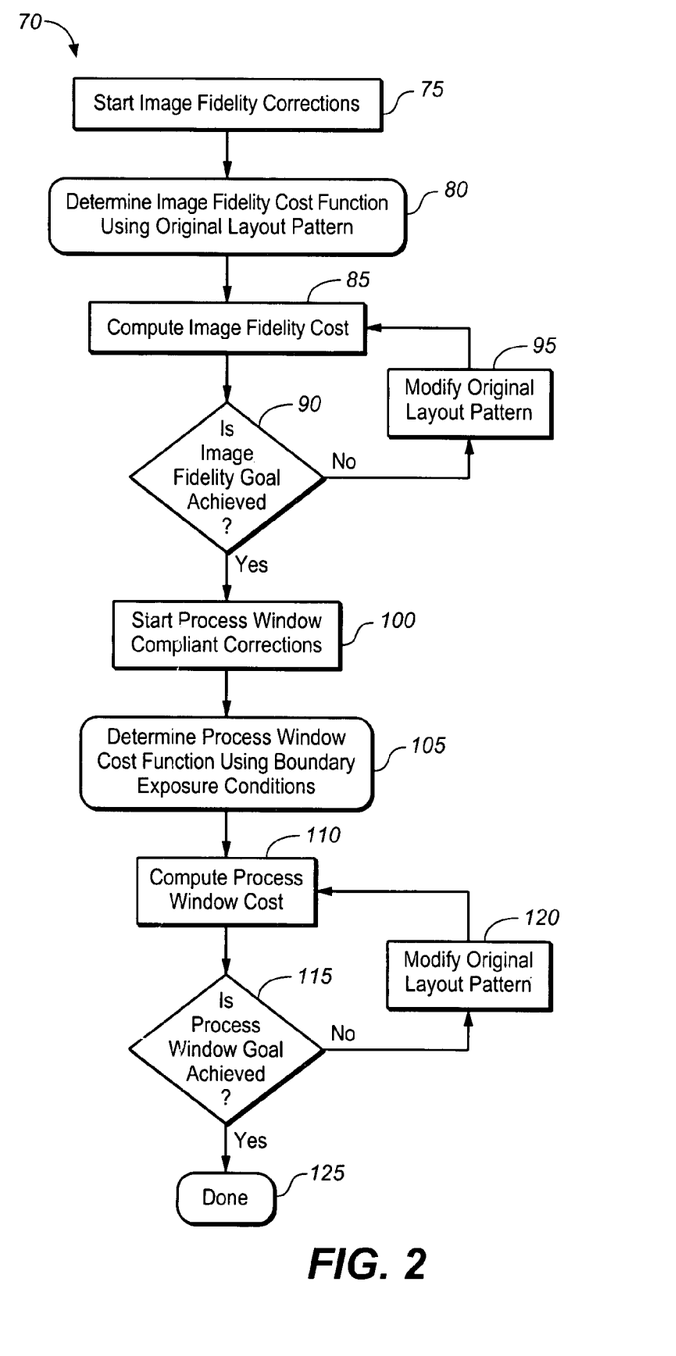
FIG. 2 is a flow chart illustrating a process for determining whether a process window goal is achieved in accordance with an embodiment of the present invention.

The invention, as illustrated in FIG. 2, is utilized in connection with a method for achieving a process window goal 70. The method 70 begins with image fidelity corrections 75. Image fidelity corrections 75 includes the following steps:
(1) Determining an image fidelity cost function using the original layout pattern 80. Image fidelity cost function is the difference between the original layout pattern and the simulated image at best exposure condition. Image fidelity goal is achieved when the difference between original layout pattern and simulated image is minimum;
(2) Computing image fidelity cost 85;
(3) Determining whether image fidelity goal is achieved 90;
  (a) If image fidelity goal is achieved, start process window compliant corrections 100;
  (b) If image fidelity goal is not achieved, modify the original layout pattern 95 and return to step (2).

The method 70 then continues with process window compliant corrections 100. Process window compliant corrections 100 include the following steps:
(4) Determining process window cost function using boundary exposure conditions 105. Process window cost function is the difference between the simulated image at best exposure condition and simulated image at boundary exposure conditions. Process window goal is achieved when the simulated image meets predefined process window specifications at boundary exposure conditions and has the minimum deviation from original layout pattern at best exposure conditions. This process is identical to the method 20 illustrated in FIG. 1;
(5) Computing process window cost 110;
(6) Determining whether process window goal is achieved 115;
  (a) If process window goal is achieved, the method is complete 125;
  (b) If process window goal is not achieved, modify the original layout pattern 120 and return to step (5).

Figure 3:
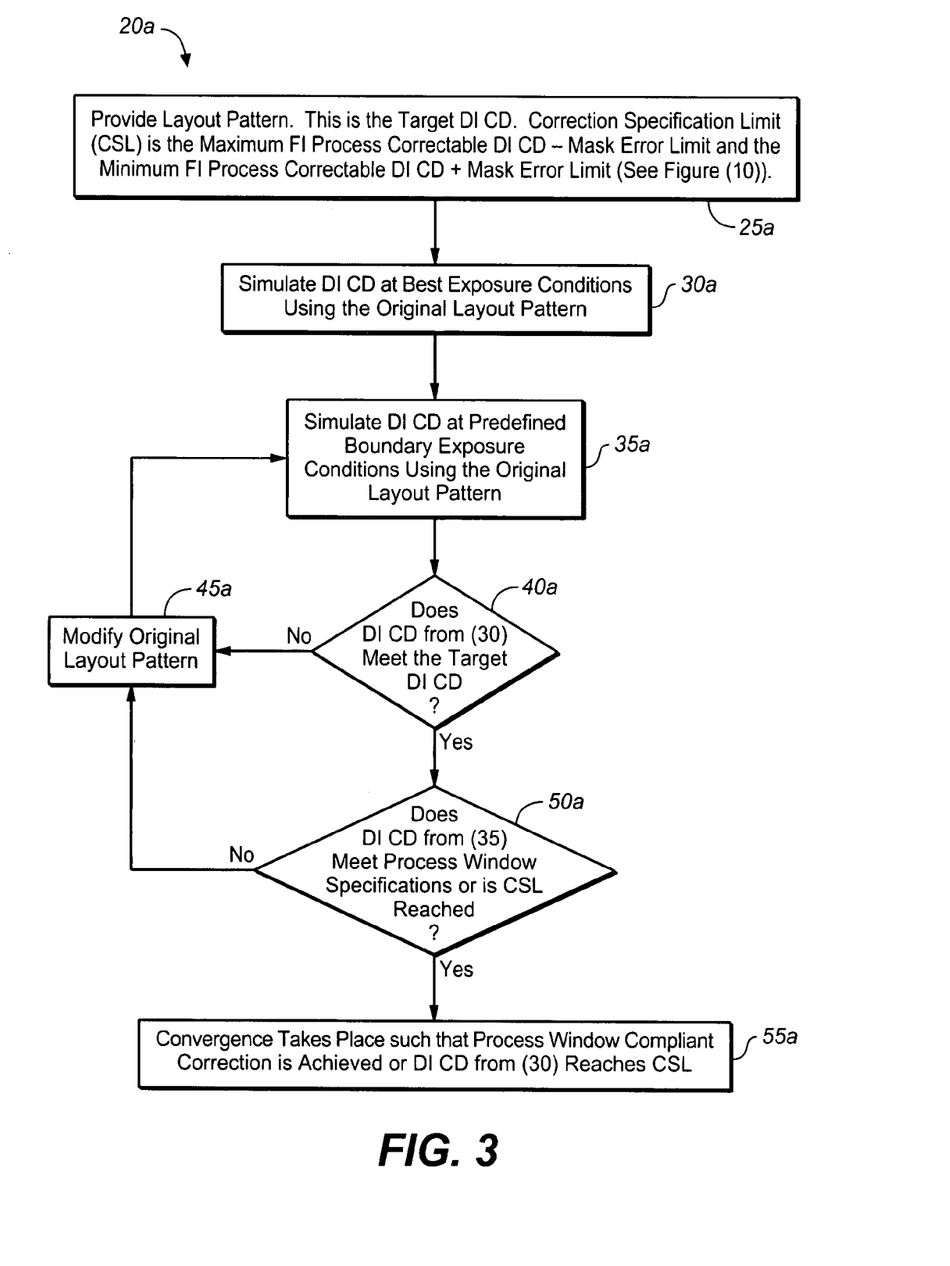
FIG. 3 is a flow chart illustrating final inspect critical dimension process window compliant correction in accordance with an embodiment of the present invention.

The invention requires pre-etch characterization structures to calibrate the pre-etch process for final inspect critical dimension. Final inspect critical dimension (FI CD) is the critical dimension after the wafer is etched. As illustrated in FIG. 3, the method 20 illustrated in FIG. 1 can also be utilized for FI CD Process Window Compliant Correction with the only difference between the method 20 in FIG. 1 and the method 20a in FIG. 3 being in connection with step (1) of the methods 20, 20a. In step (1) of the method 20, illustrated as reference numeral 25, a layout pattern is provided with the layout pattern being the target DI CD and the Correction Specification Limit (CSL), or the Correction Window, being the Upper DI CD specification limit minus the Mask error limit and the Lower DI CD specification limit plus the Mask error limit. Conversely, in step (1) of the method 20a, illustrated as reference numeral 25a, a layout pattern is provided with the layout pattern being the target DI CD and the Correction Specification Limit (CSL), or the Correction Window, being the maximum FI process correctable DI CD minus Mask error limit and the minimum FI process correctable DI CD plus the Mask error limit.

The invention can also be used for post model based OPC process window specification checks for manufacturability. The invention can further be used for post SRAF manufacturability checks.

Figure 4:
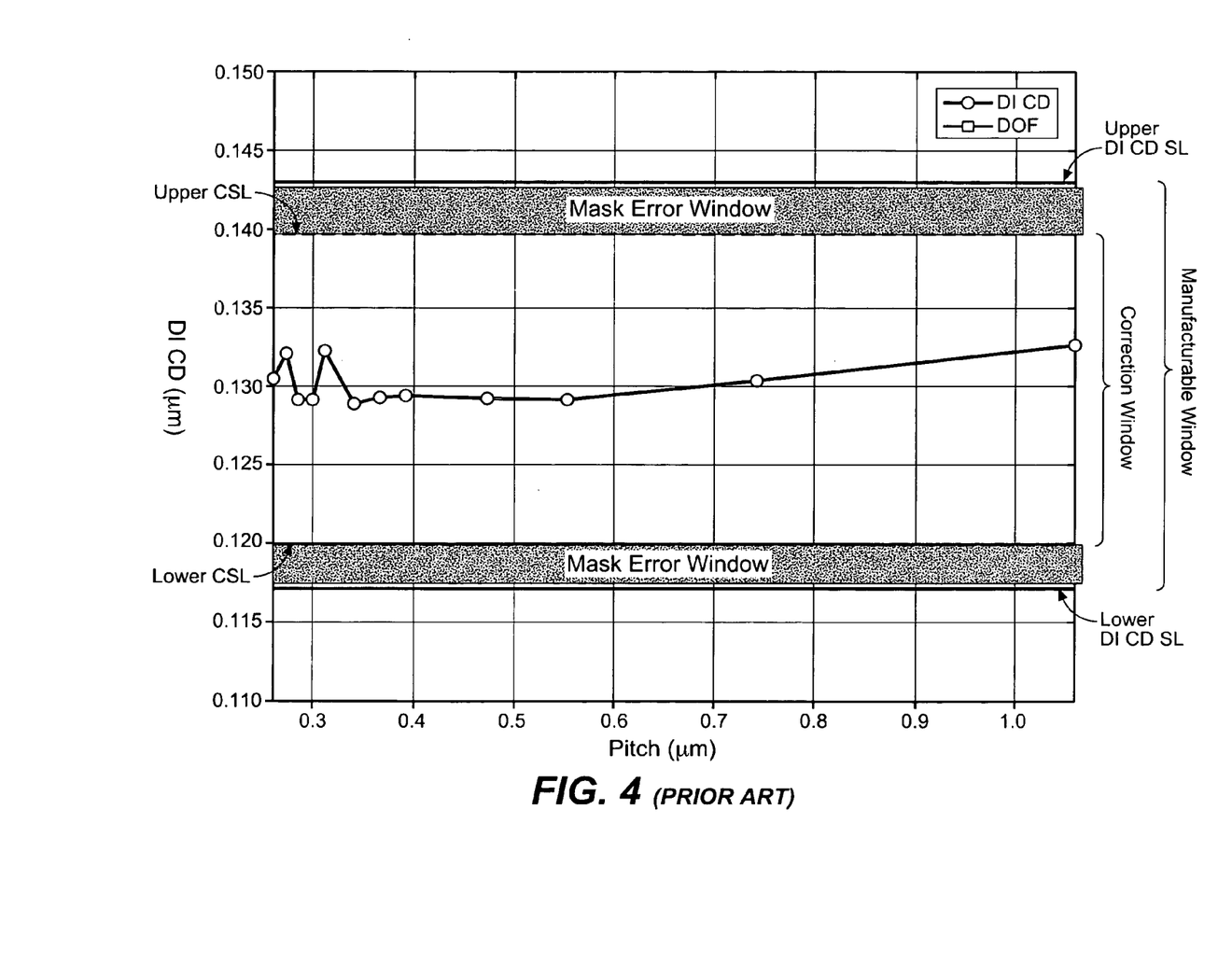
FIG. 4 is a graph of a prior art island model-based OPC.
Figure 5:
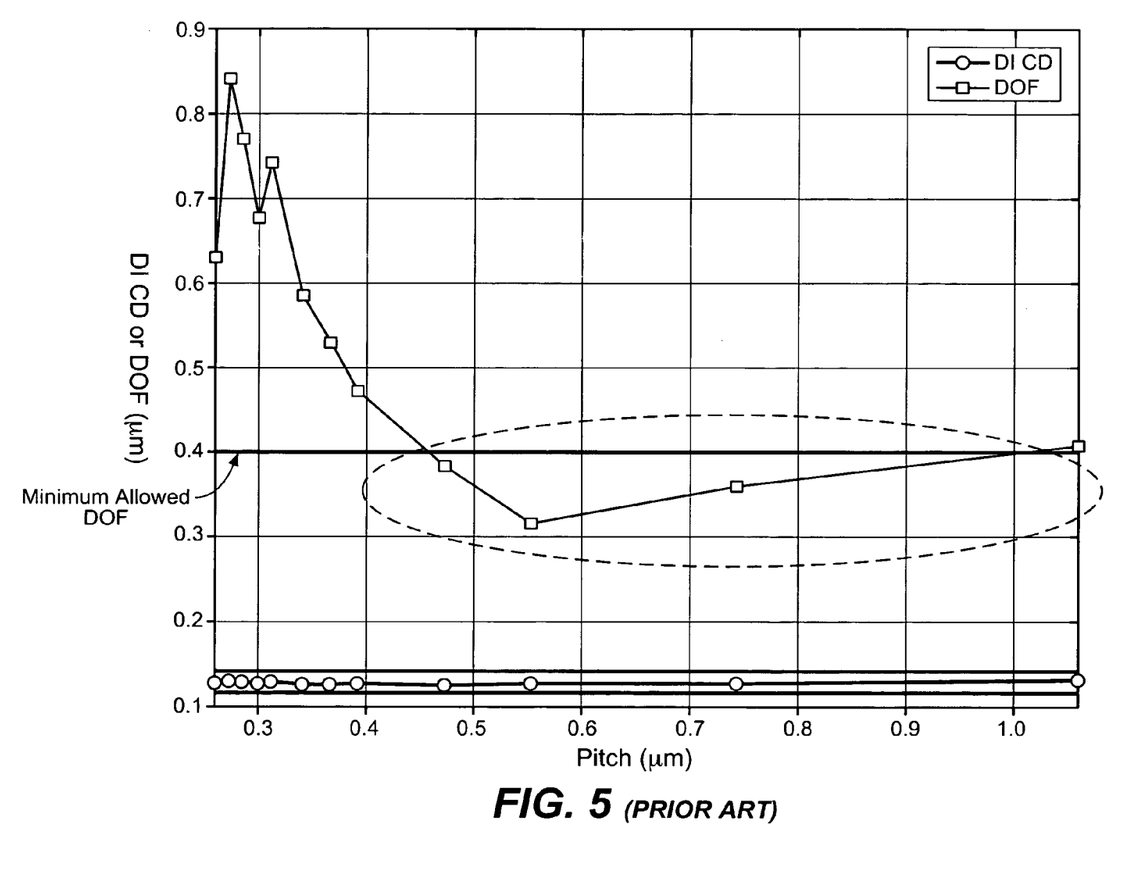
FIG. 5 is a graph of a prior art island model-based OPC DOF.

The Island Model-Based OPC as described in the Background of the Invention herein is graphically illustrated in FIG. 4 and the Island Model-Based OPC DOF as described in the Background of the Invention herein is graphically illustrated in FIG. 5. As illustrated in FIG. 4, the model based correction at best exposure conditions is well within the correction window. This is as far as the method of the prior art would go. However, as illustrated in FIG. 5, even though the model based corrections illustrated in FIG. 4 at best exposure conditions are well within the correction window, these corrections (circled) are not process window compliant since the DOF is below the minimum allowed DOF for lithography manufacturability.

Figure 6:
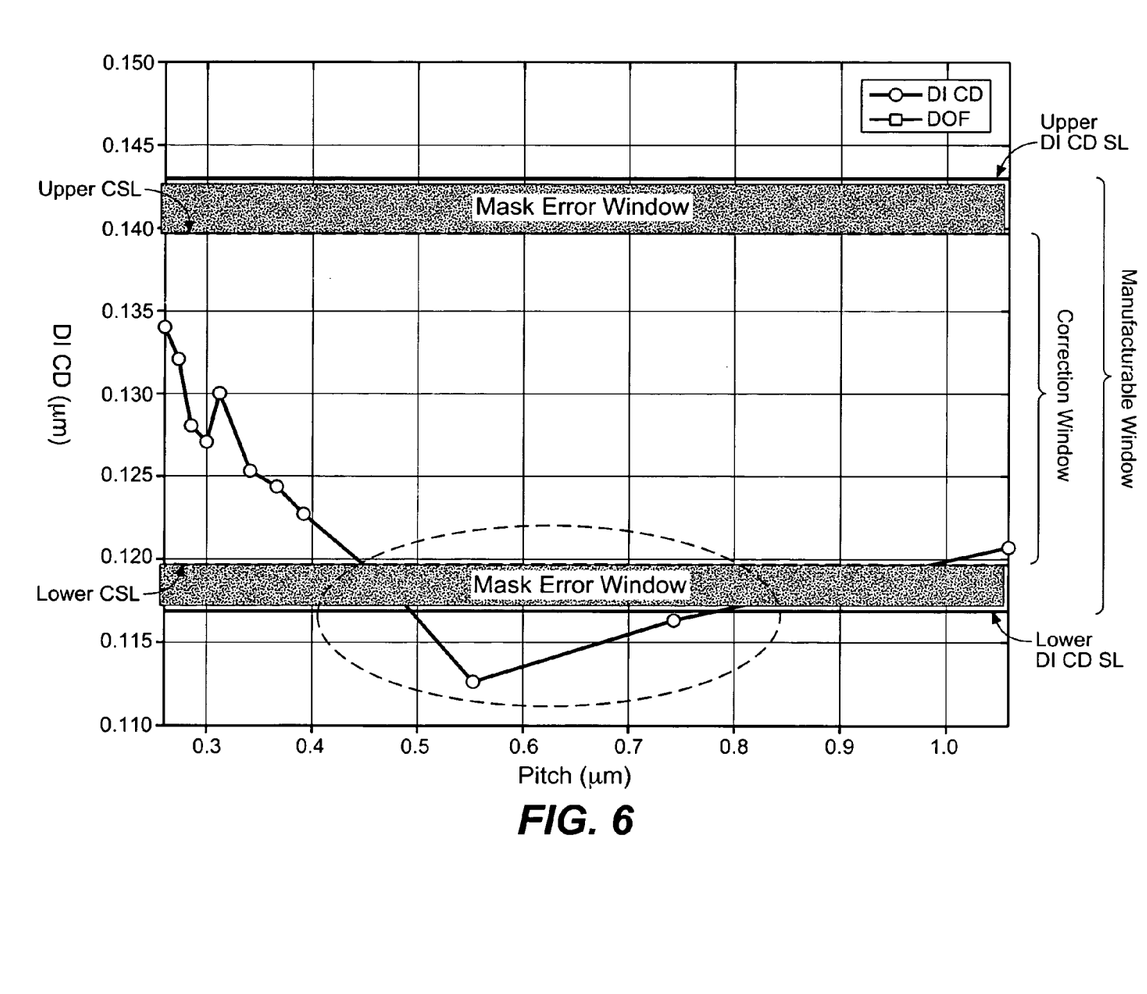
FIG. 6 is a graph of an island model-based OPC at 0.2 μm Focus in accordance with an embodiment of the present invention.

FIGS. 6–10 graphically illustrate the methods 20 and 20a from FIGS. 1 and 3, respectively. FIG. 6 graphically illustrates an Island Model-Based OPC at 0.2 µm Focus at the step of method 20 defined by reference numeral 50 with the DI CD from 35 being out of the correction window at boundary exposure conditions, thus requiring the modifying of the original layout pattern at 45. Integrated circuit devices with these correction DI CD's swill likely fail.

Figure 7:
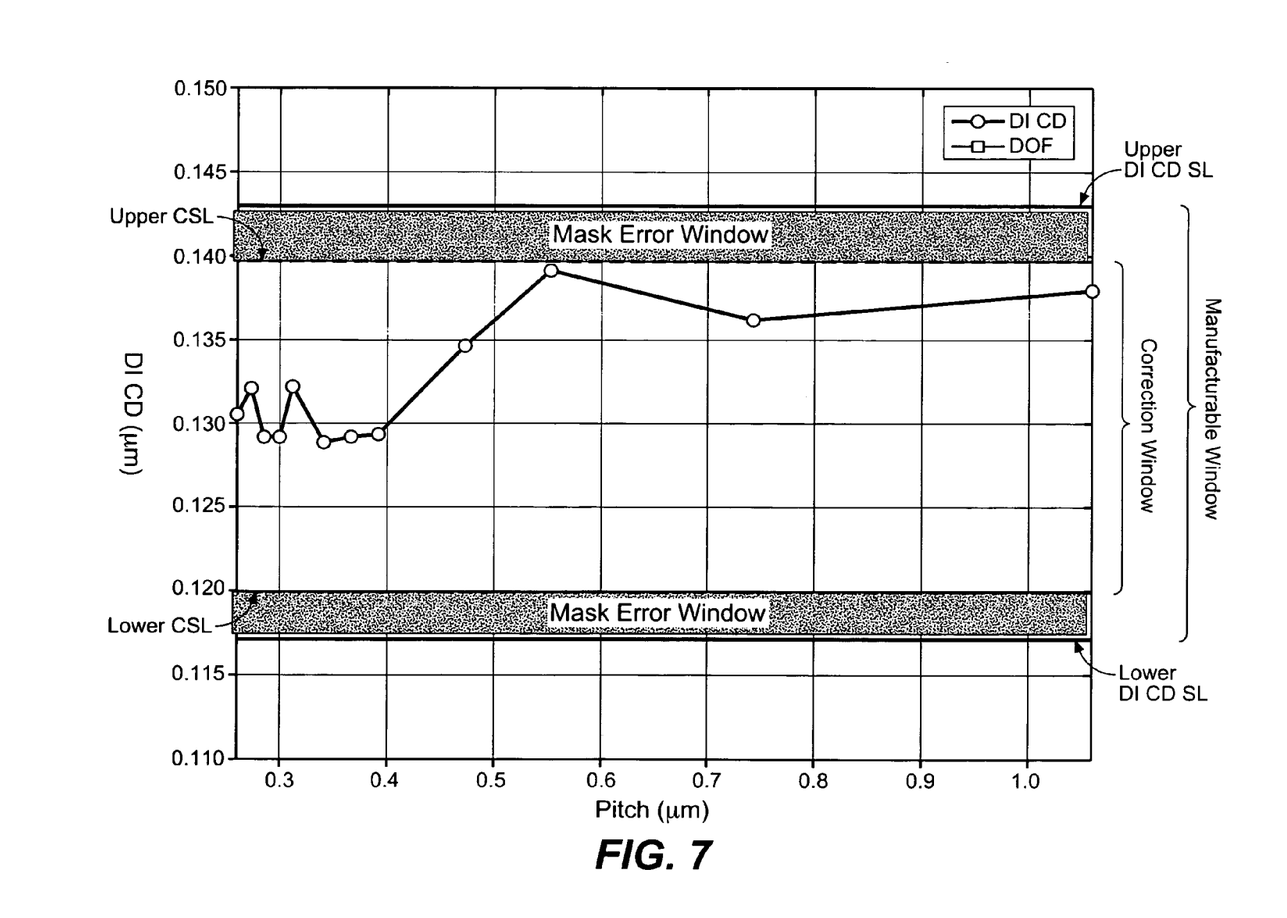
FIG. 7 is a graph of an island 0.4 μm process window compliant correction in accordance with an embodiment of the present invention.

FIG. 7 graphically illustrates an Island 0.4 µm Process Window Compliant Correction at the step of method 20 defined by reference numeral 40 with the process window compliant at best exposure conditions being within the correction window.

Figure 8:
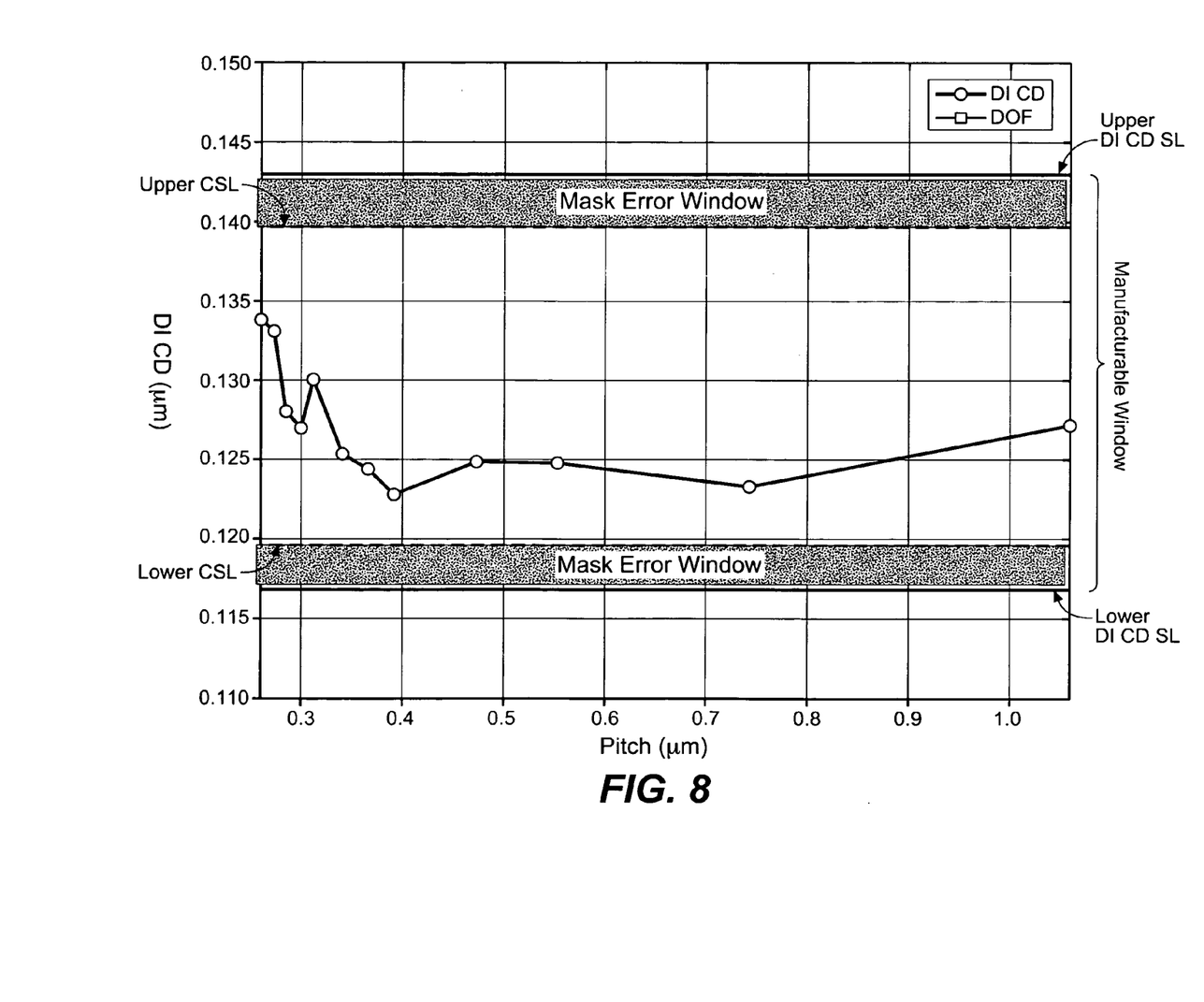
FIG. 8 is a graph of an island 0.4 μm DOF compliant correction at 0.2 μm focus in accordance with an embodiment of the present invention.

FIG. 8 graphically illustrates an Island 0.4 µm DOF Compliant Correction as 0.2 µm Focus at the step of method 20 defined by reference numeral 50 with the process window compliant correction at boundary exposure conditions being within the correction window. Thus, manufacturability is guaranteed.

Figure 9:
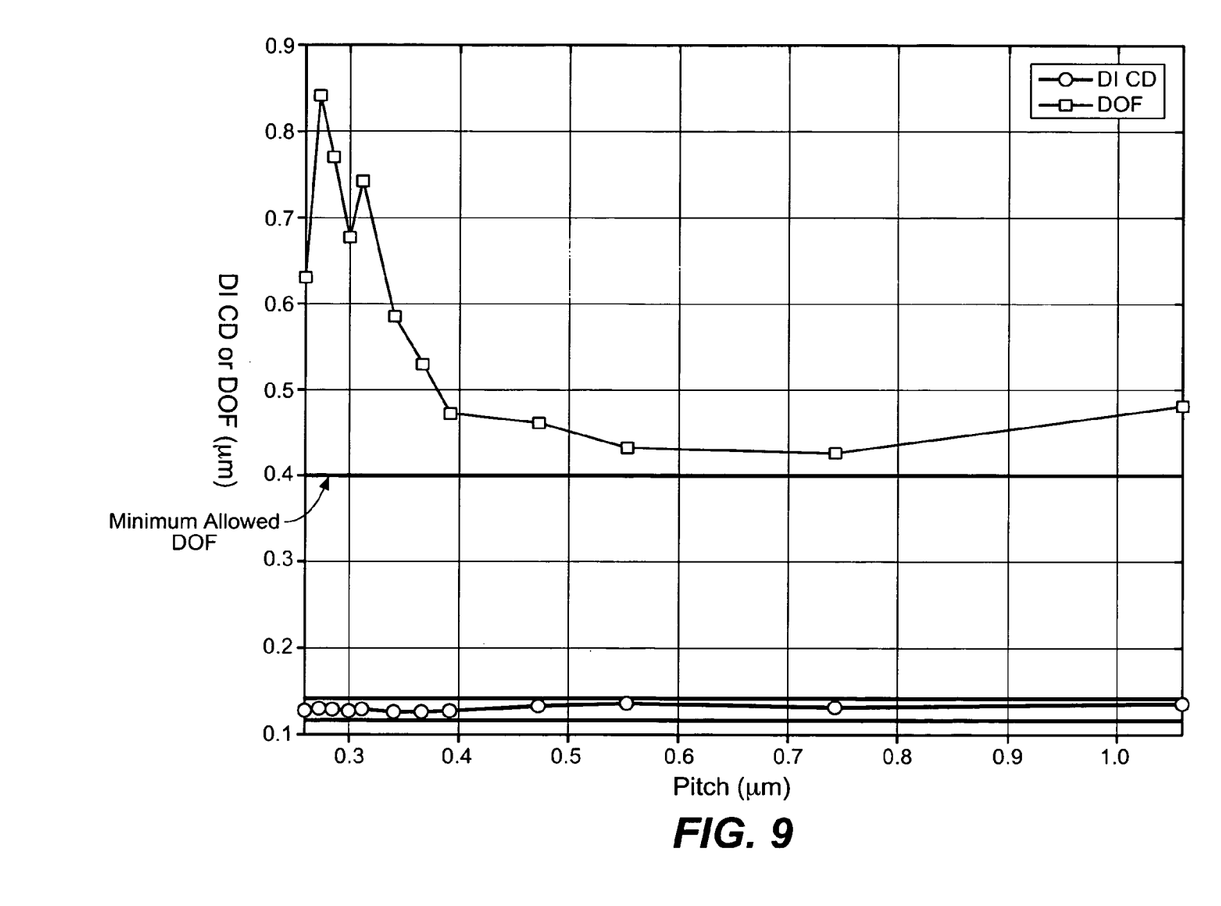
FIG. 9 is a graph of an island 0.4 μm process window compliant correction DOF in accordance with an embodiment of the present invention.

FIG. 9 graphically illustrates an Island 0.4 µm Process Window Compliant Correction DOF at the step of method 20 defined by reference numeral 55. As all of the DOF's are above the minimum allowed DOF for lithography manufacturability, process window compliant corrections is achieved.

Figure 10:
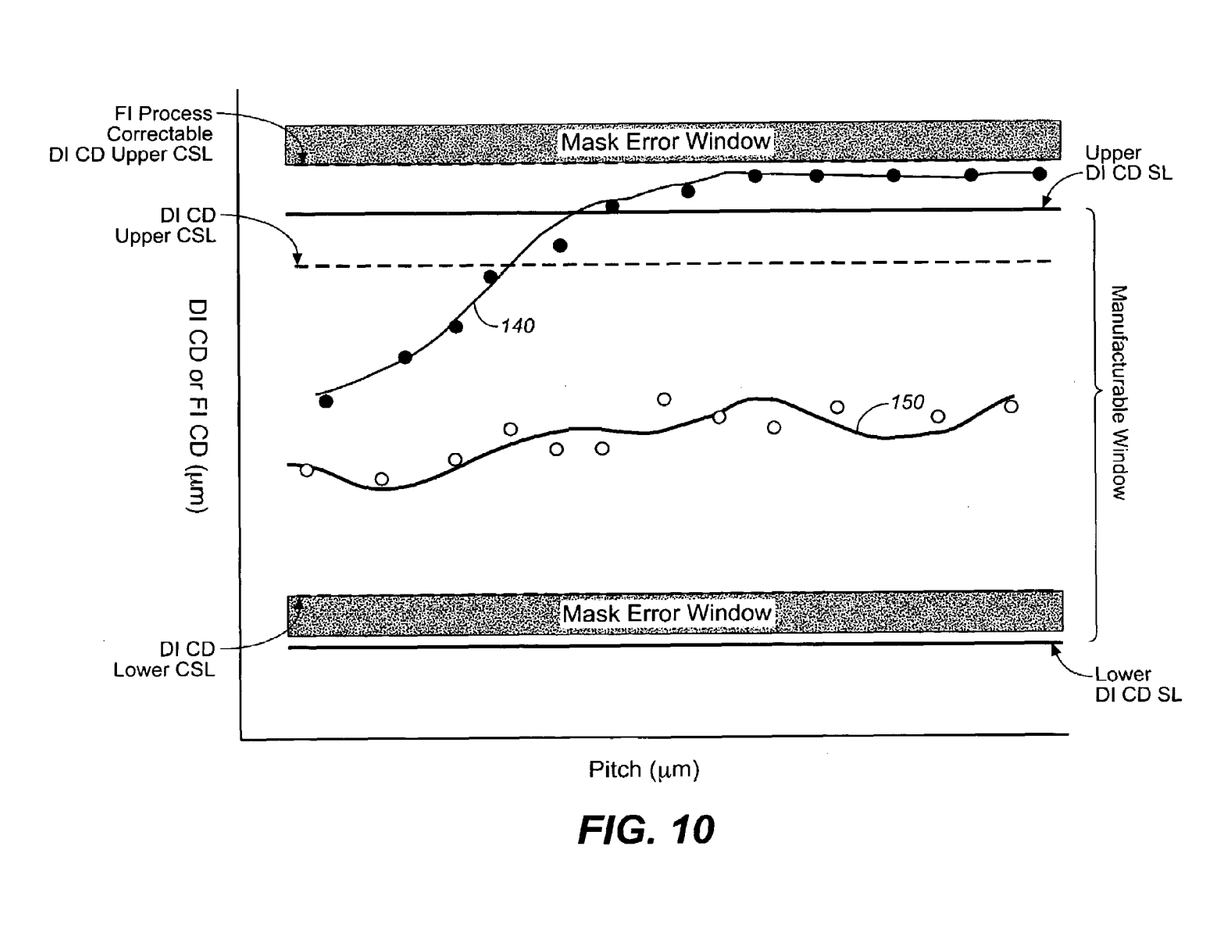
FIG. 10 is a graph illustrating the end result of the process window compliant correction in accordance with an embodiment of the present invention.

FIG. 10 graphically illustrates that the methods 20, 20a are successful by showing the process window compliant correction DI CD out manufacturable window before FI process 140 and the process window compliant correction FI CD in manufacturable window after FI process 150.

While a preferred embodiment of the present invention is shown and described, it is envisioned that those skilled in the art may devise various modifications of the present invention without departing from the spirit and scope of the appended claims.

The invention is claimed by the following:

1. A method of performing process window compliant corrections of a design layout, said method comprising the steps of:
   a) providing an original layout pattern which is the target develop inspect critical dimension definition;
   b) simulating develop inspect critical dimension at best exposure conditions using said original layout pattern;
   c) simulating develop inspect critical dimension at predefined boundary exposure conditions using said original layout pattern;
   d) converging if said develop inspect critical dimension at best exposure conditions meets said target develop inspect critical dimension definition and if said develop inspect critical dimension at predefined boundary exposure conditions meets process window specifications;
   e) if said develop inspect critical dimension at best exposure conditions does not meet said target develop inspect critical dimension definition, or if said develop inspect critical dimension at predefined boundary exposure conditions does not meet process window specifications, modifying said original layout repeating steps (c) and (d),
   wherein the target develop inspect critical dimension definition is the correction specification limit defined by an upper develop inspect dimension specification limit minus a mask error limit and a lower develop inspect critical dimension specification limit plus the mask error limit; and
   f) displaying said original layout pattern.

2. A method as defined in claim 1, wherein the target develop inspect critical dimension definition is the correction specification limit defined by a maximum final inspect process correctable develop inspect critical dimension minus a mask error limit and a minimum final inspect process correctable develop inspect critical dimension plus the mask error limit.

3. A method as defined in claim 1, wherein said develop inspect critical dimension is the critical dimension after a wafer is exposed and developed.

4. A method as defined in claim 1, wherein said target develop inspect critical dimension definition is the simulated develop inspect critical dimensions of step (c) with the minimum deviation from said original layout pattern that meet a given depth of focus and process latitude specification.

5. A method as defined in claim 1, wherein said predefined boundary exposure conditions are defocus and dose.

6. A method of achieving a process window goal, said method comprising the steps of:
   a) performing image fidelity corrections; and
   b) performing process window compliant corrections, wherein said performing image fidelity corrections includes the steps of:
   a) determining an image fidelity cost function using an original layout pattern;
   b) computing image fidelity cost;
   c) determining whether image fidelity goal is achieved;
   d) starting said process window compliant corrections if said image fidelity goal is achieved;
   e) modifying said original layout pattern and repeating steps (b), (c), and (d), if said image fidelity goal is not achieved; and
   f) displaying said original layout pattern.

7. A method as defined in claim 6, wherein said image fidelity cost function is a difference between said original layout pattern and a simulated image at best exposure conditions.

8. A method as defined in claim 6, wherein said performing process window compliant corrections includes the steps of:
a) determining process window cost function using boundary exposure conditions;
b) computing process window cost;
c) determining whether process window goal is achieved;
d) completing said method if said process window goal is achieved; and
e) modifying said original layout pattern and repeating steps (b), (c) and (d), if said process window goal is not achieved.

9. A method as defined in claim 8, wherein said process window cost function is a difference between a simulated image at best exposure conditions and a simulated image at boundary exposure conditions.

10. A method as defined in claim 8, wherein determining said process window cost function includes the steps of:
a) providing an original layout pattern which is the target develop inspect critical dimension definition;
b) simulating develop inspect critical dimension at best exposure conditions using said original layout pattern;
c) simulating develop inspect critical dimension at predefined boundary exposure conditions using said original layout pattern;
d) converging if said develop inspect critical dimension at best exposure conditions meets said target develop inspect critical dimension definition and if said develop inspect critical dimension at predefined boundary exposure conditions meets process window specifications; and
e) if said develop inspect critical dimension at best exposure conditions does not meet said target develop inspect critical dimension definition, or if said develop inspect critical dimension at predefined boundary exposure conditions does not meet process window specifications. modifying said original layout pattern and repeating steps (c) and (d).

11. A method of performing process window compliant corrections of a design layout, said method comprising the steps of:
a) providing an original layout pattern which is the target develop inspect critical dimension definition;
b) simulating develop inspect critical dimension at best exposure conditions using said original layout pattern;
c) simulating develop inspect critical dimension at predefined boundary exposure conditions using said original layout pattern;
d) converging if said develop inspect critical dimension at best exposure conditions meets said target develop inspect critical dimension definition and if said develop inspect critical dimension at predefined boundary exposure conditions meets process window specifications;
e) if said develop inspect critical dimension at best exposure conditions does not meet said target develop inspect critical dimension definition, or if said develop inspect critical dimension at predefined boundary exposure conditions does not meet process window specifications, modifying said original layout pattern and repeating steps (c) and (d),
wherein the target develop inspect critical dimension definition is the correction specification limit defined by a maximum final inspect process correctable develop inspect critical dimension minus a mask error limit and a minimum final inspect process correctable develop inspect critical dimension plus the mask error limit; and
f) displaying said original layout pattern.

12. A method as defined in claim 11, wherein the target develop inspect critical dimension definition is the correction specification limit defined by an upper develop inspect critical dimension specification limit minus a mask error limit and a lower develop inspect critical dimension specification limit plus the mask error limit.

13. A method as defined in claim 11, wherein said develop inspect critical dimension is the critical dimension after a wafer is exposed and developed.

14. A method as defined in claim 11, wherein said target develop inspect critical dimension definition is the simulated develop inspect critical dimensions of step (c) with the minimum deviation from said original layout pattern that meet a given depth of focus and process latitude specification.

15. A method as defined in claim 11, wherein said predefined boundary exposure conditions are defocus and dose.

16. A method of performing process window compliant corrections of a design layout said method comprising the steps of:
a) providing an original layout pattern which is the target develop inspect critical dimension definition;
b) simulating develop inspect critical dimension at best exposure conditions using said original layout pattern;
c) simulating develop inspect critical dimension at predefined boundary exposure conditions using said original layout pattern;
d) converging if said develop inspect critical dimension at best exposure conditions meets said target develop inspect critical dimension definition and if said develop inspect critical dimension at predefined boundary exposure conditions meets process window specifications;
e) if said develop inspect critical dimension at best exposure conditions does not meet said target develop inspect critical dimension definition, or if said develop inspect critical dimension at predefined boundary exposure conditions does not meet process window specifications, modifying said original layout pattern and repeating steps (c) and (d),
wherein said target develop inspect critical dimension definition is the simulated develop inspect critical dimensions of step (c) with the minimum deviation from said original layout pattern that meet a given depth of focus and process latitude specification; and
f) displaying said original layout pattern.

17. A method as defined in claim 16, wherein the target develop inspect critical dimension definition is the correction specification limit defined by an upper develop inspect critical dimension specification limit minus a mask error limit and a lower develop inspect critical dimension specification limit plus the mask error limit.

18. A method as defined in claim 16, wherein the target develop inspect critical dimension definition is the correction specification limit defined by a maximum final inspect process correctable develop inspect critical dimension minus a mask error limit and a minimum final inspect process correctable develop inspect critical dimension plus the mask error limit.

19. A method as defined in claim 16, wherein said develop inspect critical dimension is the critical dimension after a wafer is exposed and developed.

20. A method as defined in claim 16, wherein said predefined boundary exposure conditions are defocus and dose.

21. A method of achieving a process window goal, said method comprising the steps of:
   a) performing image fidelity corrections; and
   b) performing process window compliant corrections, wherein said performing process window compliant corrections includes the steps of:
   a) determining process window cost function using boundary exposure conditions;
   b) computing process window cost;
   c) determining whether process window goal is achieved;
   d) completing said method if said process window goal is achieved;
   e) modifying the original layout pattern and repeating steps (b), (c) and (d), if said process window goal is not achieved; and
   f) displaying said original layout pattern.

22. A method as defined in claim 21, wherein said performing image fidelity corrections includes the steps of:
   a) determining an image fidelity cost function using an original, layout pattern;
   b) computing image fidelity cost;
   c) determining whether image fidelity goal is achieved;
   d) starting said process window compliant corrections if said image fidelity goal is achieved; and
   e) modifying said original layout pattern and repeating steps (b), (c) and (d), if said image fidelity goal is not achieved.

23. A method as defined in claim 22, wherein said image fidelity cost function is a difference between said original layout pattern and a simulated image at best exposure conditions.

24. A method as defined in claim 21, wherein said process window cost function is a difference between a simulated image at best exposure conditions and a simulated image at boundary exposure conditions.

25. A method as defined in claim 21, wherein determining said process window cost function includes the steps of:
   a) providing an original layout pattern which is the target develop inspect critical dimension definition;
   b) simulating develop inspect critical dimension at best exposure conditions using said original layout pattern;
   c) simulating develop inspect critical dimension at predefined boundary exposure conditions using said original layout pattern;
   d) converging if said develop inspect critical dimension at best exposure conditions meets said target develop inspect critical dimension definition and if said develop inspect critical dimension at predefined boundary exposure conditions meets process window specifications; and
   e) if said develop inspect critical dimension at best exposure conditions does not meet said target develop inspect critical dimension definition, or if said develop inspect critical dimension at predefined boundary exposure conditions does not meet process window specifications, modifying said original layout pattern and repeating steps (c) and (d).

* * * * *